(12) United States Patent
Sheek et al.

(10) Patent No.: US 7,026,057 B2
(45) Date of Patent: Apr. 11, 2006

(54) CORROSION AND ABRASION RESISTANT DECORATIVE COATING

(75) Inventors: James G. Sheek, Sanford, NC (US); Jarek Grembowicz, Sanford, NC (US); Inho Song, Mayfield Heights, OH (US); Timothy J. O'Brien, Bay Village, OH (US)

(73) Assignee: Moen Incorporated, North Olmsted, OH (US)

( * ) Notice: Subject to any disclaimer, the term of this patent is extended or adjusted under 35 U.S.C. 154(b) by 0 days.

(21) Appl. No.: 10/055,301

(22) Filed: Jan. 23, 2002

(65) Prior Publication Data

US 2003/0139106 A1   Jul. 24, 2003

(51) Int. Cl.
*B32B 15/04*   (2006.01)

(52) U.S. Cl. .................. 428/610; 428/621; 428/627; 428/670; 428/671; 428/673; 428/666; 428/685; 428/938

(58) Field of Classification Search ................ 428/610, 428/627, 621, 672, 671, 670, 673, 685, 666, 428/938
See application file for complete search history.

(56) References Cited

U.S. PATENT DOCUMENTS

| | | | |
|---|---|---|---|
| 2,852,415 | A | 9/1958 | Colbert et al. |
| 3,958,070 | A | 5/1976 | Schintlmeister et al. |
| 4,209,552 | A | 6/1980 | Welch |
| 4,219,199 | A | 8/1980 | Okuda |
| 4,296,178 | A | 10/1981 | Griesenauer et al. |
| 4,351,855 | A | 9/1982 | Pinkhasov |
| 4,369,225 | A | 1/1983 | Manabe et al. |
| 4,395,313 | A | 7/1983 | Lindsay et al. |
| 4,402,998 | A | 9/1983 | Kumagai et al. |
| 4,403,014 | A * | 9/1983 | Bergmann ................ 428/546 |
| 4,407,998 | A | 10/1983 | Duvdevani |
| 4,415,421 | A | 11/1983 | Sasanuma |
| 4,420,498 | A | 12/1983 | Hirose et al. |
| 4,426,267 | A | 1/1984 | Munz et al. |
| 4,431,711 | A | 2/1984 | Eisfeller |
| 4,438,153 | A | 3/1984 | Pinkhasov |
| 4,447,473 | A | 5/1984 | Mashida et al. |
| 4,466,872 | A | 8/1984 | Einbinder |
| 4,470,895 | A | 9/1984 | Coad et al. |
| 4,517,217 | A | 5/1985 | Hoffman |
| 4,524,106 | A | 6/1985 | Flasck |

(Continued)

FOREIGN PATENT DOCUMENTS

EP   0 353 060 A2   1/1990

(Continued)

OTHER PUBLICATIONS

Schulz,S. "Decorative Coating with Physical Coating Processes," Leybold AG Technical Pubn. 11-S36.02, Hanau, Germany.

(Continued)

*Primary Examiner*—John J. Zimmerman
(74) *Attorney, Agent, or Firm*—Calfee, Halter & Griswold LLP

(57) ABSTRACT

A new article of manufacture, for example a faucet or other article of hardware, has a specified decorative color, and is resistant to corrosion, abrasion and attack by chemicals. The article includes a substrate, one or more corrosion resistant layers applied to the substrate, a thin transition layer having a composition that varies systematically from a first composition to a second composition and in which the first composition has, at least in part, the function of corrosion protection, and in which the second composition determines the visible color or that portion of the substrate to which the transition layer is applied.

22 Claims, 4 Drawing Sheets

U.S. PATENT DOCUMENTS

| | | |
|---|---|---|
| 4,544,468 A | 10/1985 | Munz et al. |
| 4,582,564 A | 4/1986 | Shanefield et al. |
| 4,590,031 A | 5/1986 | Eichen et al. |
| 4,591,418 A | 5/1986 | Snyder |
| 4,603,057 A | 7/1986 | Ueno et al. |
| 4,604,168 A | 8/1986 | Liu et al. |
| 4,606,941 A | 8/1986 | Jenkin |
| 4,612,216 A | 9/1986 | Kurfman |
| 4,620,913 A | 11/1986 | Bergman |
| 4,629,662 A | 12/1986 | Brownlow et al. |
| 4,680,438 A * | 7/1987 | Witting et al. ............. 200/268 |
| 4,713,150 A | 12/1987 | Hornbostel et al. |
| 4,716,083 A | 12/1987 | Eichen et al. |
| 4,737,252 A | 4/1988 | Hoffman |
| 4,763,601 A | 8/1988 | Saida et al. |
| 4,824,540 A | 4/1989 | Stuart |
| 4,842,945 A | 6/1989 | Ito et al. |
| 4,849,082 A | 7/1989 | Baty et al. |
| 4,876,119 A | 10/1989 | Takeda et al. |
| 4,882,022 A | 11/1989 | Hoffman et al. |
| 4,895,630 A | 1/1990 | Aufderheide |
| 4,900,630 A | 2/1990 | Suzuki et al. |
| 4,911,811 A | 3/1990 | Mullaney, Jr. |
| 4,919,773 A | 4/1990 | Naik |
| 4,937,094 A | 6/1990 | Doehler et al. |
| 4,950,365 A | 8/1990 | Evans |
| 4,973,388 A | 11/1990 | Francois et al. |
| RE33,530 E | 2/1991 | Munz et al. |
| 5,015,308 A | 5/1991 | Yamagata |
| 5,022,978 A | 6/1991 | Hensel et al. |
| 5,037,517 A * | 8/1991 | Randhawa ............. 204/192.15 |
| 5,055,318 A | 10/1991 | Deutchman et al. |
| 5,091,209 A | 2/1992 | Claverie et al. |
| 5,126,030 A | 6/1992 | Tamagaki et al. |
| 5,234,560 A | 8/1993 | Kadlec et al. |
| 5,234,561 A | 8/1993 | Randhawa et al. |
| 5,366,764 A | 11/1994 | Sunthankar |
| 5,374,451 A | 12/1994 | Servais et al. |
| 5,407,548 A | 4/1995 | Kopacz et al. |
| 5,413,874 A | 5/1995 | Moysan, III et al. |
| 5,426,000 A * | 6/1995 | Labib et al. ............. 428/547 |
| 5,429,070 A | 7/1995 | Campbell et al. |
| 5,447,803 A | 9/1995 | Nagaoka et al. |
| 5,458,754 A | 10/1995 | Sathrum et al. |
| 5,458,928 A | 10/1995 | Kiyama et al. |
| 5,476,724 A | 12/1995 | Moysan, III et al. |
| 5,478,659 A | 12/1995 | Moysan, III et al. |
| 5,478,660 A | 12/1995 | Moysan, III et al. |
| 5,482,788 A | 1/1996 | Moysan, III et al. |
| 5,484,663 A | 1/1996 | Moysan, III et al. |
| 5,492,725 A | 2/1996 | Gordon |
| 5,510,012 A | 4/1996 | Schulz et al. |
| 5,512,164 A | 4/1996 | Timberlake |
| 5,543,183 A | 8/1996 | Streckert et al. |
| 5,552,233 A | 9/1996 | Moysan, III et al. |
| 5,624,486 A | 4/1997 | Schmid et al. |
| 5,626,972 A | 5/1997 | Moysan, III et al. |
| 5,639,564 A | 6/1997 | Moysan, III et al. |
| 5,641,579 A | 6/1997 | Moysan, III et al. |
| 5,648,179 A | 7/1997 | Moysan, III et al. |
| 5,654,108 A | 8/1997 | Moysan, III et al. |
| 5,667,904 A | 9/1997 | Moysan, III et al. |
| 5,683,756 A | 11/1997 | Tanner et al. |
| 5,693,427 A | 12/1997 | Moysan, III et al. |
| 5,705,230 A | 1/1998 | Matanabe et al. |
| 5,716,721 A | 2/1998 | Moysan, III et al. |
| 5,720,821 A | 2/1998 | Halpern |
| 5,752,395 A | 5/1998 | Nakamura |
| 5,759,677 A | 6/1998 | Fink |
| 5,773,154 A | 6/1998 | Takada |
| 5,783,313 A | 7/1998 | Moysan, III et al. |
| 5,788,823 A | 8/1998 | Warnes et al. |
| 5,798,148 A | 8/1998 | Thomas et al. |
| 5,814,415 A | 9/1998 | Moysan, III et al. |
| 5,858,181 A | 1/1999 | Jindal et al. |
| 5,879,532 A | 3/1999 | Foster et al. |
| 5,891,556 A | 4/1999 | Anderson et al. |
| 5,897,753 A | 4/1999 | Schatz et al. |
| 5,922,478 A | 7/1999 | Welty et al. |
| 5,976,634 A | 11/1999 | Tanner et al. |
| 5,976,639 A | 11/1999 | Iwata |
| 5,985,468 A | 11/1999 | Sugg et al. |
| 6,143,424 A | 11/2000 | Jonte et al. |
| 6,221,231 B1 | 4/2001 | Foster |
| 6,245,435 B1 * | 6/2001 | O'Brien et al. ............. 428/472 |
| 6,454,861 B1 * | 9/2002 | Chaleix et al. ............. 118/718 |

FOREIGN PATENT DOCUMENTS

| | | | |
|---|---|---|---|
| EP | 0 430 874 A1 | | 6/1991 |
| EP | 0875 598 A1 | | 4/1998 |
| GB | 2126256 | * | 3/1984 |
| GB | 2 173 218 A | | 10/1986 |
| GB | 2284431 | * | 6/1995 |
| GB | 2314604 | * | 1/1998 |
| JP | 63-129102 | * | 6/1988 |
| JP | 03 240 942 | | 10/1991 |
| JP | 06-017230 | * | 1/1994 |
| JP | 06-073530 | * | 3/1994 |
| JP | 11 2311125 A | | 11/1999 |
| JP | 2000 303163 A | | 5/2001 |

OTHER PUBLICATIONS

Schulz, S., "New Directions in Decorative Hard Coatings," Leybold AG Technical Pubn. 11-S37.02 presented at Deco-Symposium Japan, Kyoto, Japan, Jul. 12, 1990, Hanau, Germany.

Schulz, S. "What You Ever Wanted to Know About Deco Coatings," Leybold AG Newsletter, Alzenau, Germany, Feb. 1991.

Brown, Richard, and Alia, Mohd. N., "Oxidation of Nitride Films in Aqueous Solution: Correlation Between Surface Surface Analysis and Electrochemical Studies," University of Rhode Island Paper No. 322, presented at the Annual Conference and Corrosion Show, 1994.

Van Leaven, L., Alias, M.N. and Brown, R., "Corrosion Behavior of Ion Plated and Implanted Films," Surface and Coatings Technology, 53 (1992) pp. 25-34.

Ristolainin, E.O., Molarius, J.M., Korhonen, A.S., and Lindroos, V.K., "A Study of Nitrogen-rich Titanium and Zirconium Nitride Films," J.Vac.Sci,Technol.A vol. 5 No. 4 Jul./Aug. 1987 (pp. 2184-2189), USA.

Johansson, B.O., Hentzell, H.T.G., Harper, J.M.E. and Cuomo, J.J., "Higher Nitrides of Hafnium, Zirconium, and Titanium Synthesized by Dual Ion Beam Deposition," J. Mater.Res., vol. 1, No. 3, May/Jun. 1986, pp. 445-451, USA.

Jehn, Von H.A., Pfeifer-Schaller, I., and Baumagtner, M.E., "Corrosion of Hard Coatings," Galvanotechnik 84 (1993) Nr. 12, pp. 4059-4964, Saulgau, Germany.

Kusano E. et al., "Adhesion and Hardness of Compositionally Gradient TiO2/Ti/TiN, ZrO2/Zr/ZrN, and TiO2/Ti/Zr/ZrN Coatings" Thin Solid Films, Elsevier-Sequoia S,A. Lausanne, CH, vol., 334 No. 1/2; Dec. 4, 1998.

* cited by examiner

CORROSION AND ABRASION RESISTANT DECORATIVE COATING

THE FIELD OF THE INVENTION

The present invention relates to decorative coatings for articles of manufacture such as faucets and related plumbing products including shower heads, escutcheons, tub spouts and the like. More specifically, the invention concerns a decorative coating for such a product, which is resistant to corrosion, abrasion and attack by chemicals. The invention is particularly concerned with such a decorative coating which resists corrosion, a common problem in many present day decorative coatings. There are numerous prior art patents which disclose the use of zirconium to provide a corrosion resistant brass appearing decorative coating. More recently, it has been determined that decorative layers applied by physical vapor deposition (PVD) processes, and containing zirconium or hafnium as the only metallic species, are unusually and advantageously compared with the decorative layers containing other metals because normally they do not degrade the corrosion resistance of the coated article. Such layers can be used to extend the range of decorative PVD colors available from brass tones alone to black, gray and gold tones. Still more recently, it has been determined that the presence of zirconium or hafnium as the sole metallic species in the decorative layer at the surface is not a sufficient condition to insure that the corrosion resistance of the coated article is not degraded. Some non-brass decorative PVD colors, and specifically the range of copper tones, still do not perform acceptably in corrosion testing even when zirconium is substantially the only metal in the PVD layer at the surface. The current invention extends the range of colors to include copper. More generally, the current invention can be used to solve a common problem of paradox encountered in surface engineering when a layer of material is required to fulfill several functions simultaneously and its thickness therefore is subject to several different and contradictory constraints.

SUMMARY OF THE INVENTION

The present invention relates to articles of manufacture with a decorative coating and more specifically to such a coating which is resistant to corrosion, abrasion and attack by chemicals. A primary purpose of the invention is to provide a new article of manufacture which has a specified decorative color, for example copper, and includes a thin outer transition layer in which the composition varies systematically from a first composition to a second composition.

Another purpose is an article of manufacture of the type described in which the outer transition layer, together with an underlying color layer, applied by physical vapor deposition, can provide different colors, depending upon the specific parameters of the deposition process.

Another purpose is a corrosion resistant article of manufacture of the type described, for example, door hardware or a faucet or related plumbing component, having enhanced corrosion resistance.

Another purpose of the invention is to provide a corrosion resistant article of manufacture having an exterior transition layer of a first composition and a second composition and in which the first composition has, at least in part, the function of corrosion protection, and in which the second composition determines the visible color of the article.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

Figure 1:
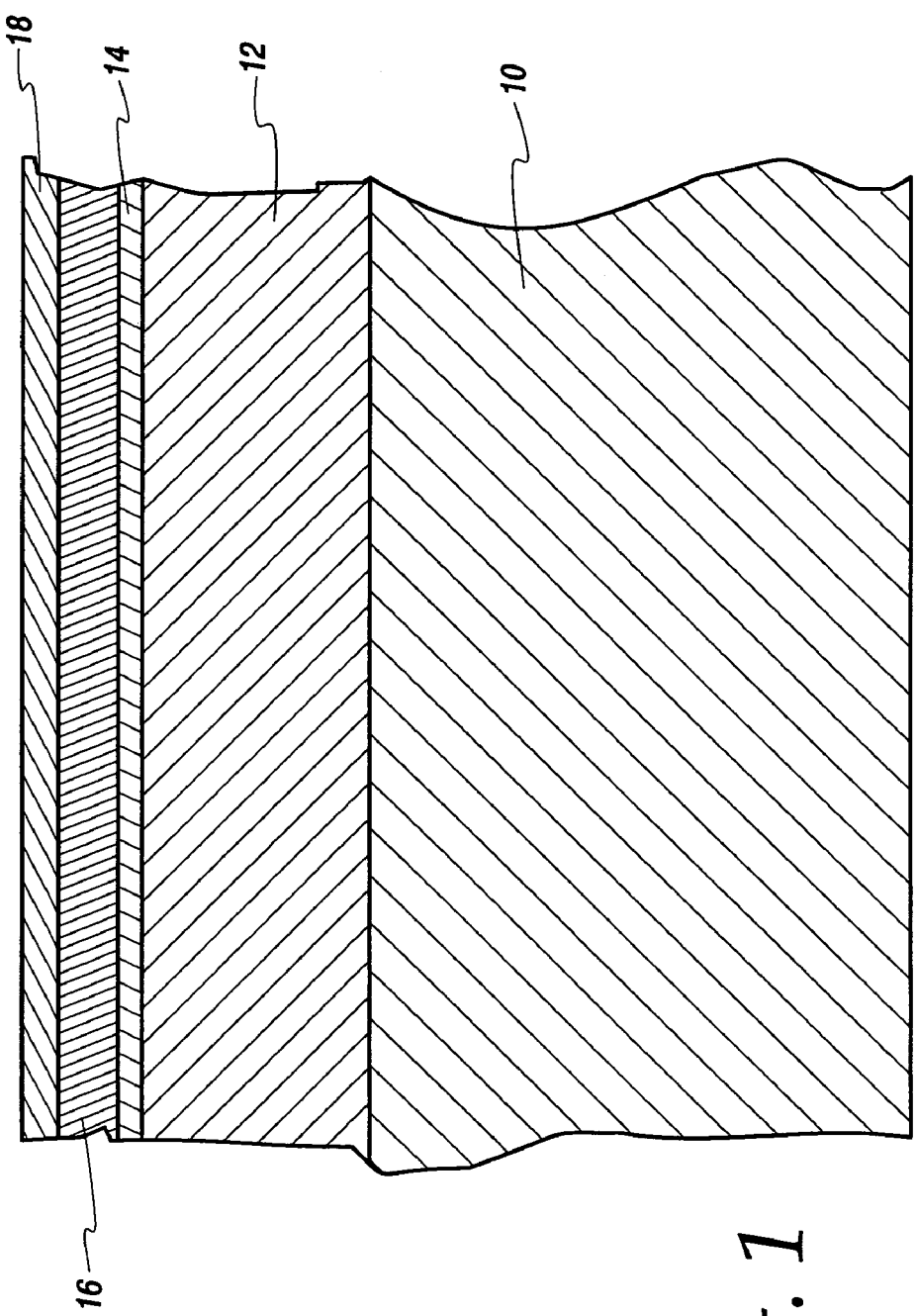
FIG. 1 is a portion of the article of manufacture disclosed herein.

Many household objects, for example faucets and related plumbing products, include components which are designed to have both decorative and functional aspects. Frequently, such components consist first of a substrate, which establishes the shape and mechanical function, and second, of a finish which provides the decorative aspect of the article, resistance to corrosion or tarnish, resistance to chemical attack, resistance to abrasion or impact, or a combination of these enhancements. Usually the finish consists of a stack of one or more layers of material which are thin relative to the dimensions of the substrate. A finishing process consists generally of the steps necessary to apply the layers, plus some other intermediate steps in which the surface is cleaned or the surface texture or chemical properties are altered by physical or chemical means.

Until approximately 1980 the most well established decorative finishing processes were electroplating and painting with liquid or powder polymer systems. More recently new classes of finishing processes have appeared which rely on new technology, frequently involving the use of a vacuum chamber or pressure vessel. The list of such modern processes includes PVD, CVD, PECVD, ion plating and MOCVD. Physical vapor deposition (PVD) is a collective name for a class of processes which have become particularly popular in the U.S. in the 1990s for application of a durable, scratch resistant polished brass finish to zinc, plastic, steel or brass substrates. U.S. Pat. No. 5,759,677 owned by Moen Incorporated, the assignee of the present application, describes one such process for providing a brass appearing durable finish on a substrate such as a faucet. U.S. Pat. Nos. 5,814,415, 5,783,313, 5,716,721, 5,693,427, 5,667,904, 5,654,108, 5,648,179, 5,641,579, 5,639,564, 5,626,972, 5,552,233, 5,484,663, 5,482,788, 5,478,660, 5,478,659, 5,476,724 and 5,413,874, owned by Baldwin Hardware Corp. of Reading, Pa., describe a series of processes which are focused toward corrosion protection and providing a brass appearing decorative finish for various types of hardware products. The specific parameters used in such processes and described in the patents are herein incorporated by reference, as they provide technology to those skilled relative to the use of PVD processes.

The above patents describe the use of compounds of zirconium with nitrogen and carbon to create a PVD polished brass finish. Commonly the PVD layer furnishes color, scratch resistance and resistance to chemical attack. On metallic substrates a separate electroplated layer system commonly is furnished under the PVD layer or layers to provide corrosion resistance. The electroplated system usually consists of a standard chrome electroplate system and sometimes of a more expensive alternative such as nickel, duplex nickel, palladium nickel, tin nickel or nickel boron and tungsten, the details of which are disclosed in the above-described Baldwin Hardware patents. PVD ZrN polished brass is only one member of a very large class of color finishes that can be created using the PVD process with one or more metals and process gases containing nitrogen, carbon, hydrogen, argon and oxygen.

Briefly, in the sputter ion physical vapor deposition process the refractory metal, such as titanium or zirconium target, which is the cathode, and the substrate are placed in a vacuum chamber. The air in the chamber is evacuated to produce vacuum conditions in the chamber. An inert gas, such as argon, is introduced into the chamber. The gas particles are ionized and are accelerated to the target to dislodge titanium or zirconium atoms. The dislodged target material is then typically deposited as a coating film on the substrate.

It has been determined that the ZrN finish is unusual in that it provides acceptable corrosion performance when applied to corrosion sensitive substrates such as zinc, in conjunction with a chrome electroplate corrosion barrier system. It has also been determined that the use of other metals in the finished decorative layer, such as titanium, aluminum or chromium, will actually degrade the corrosion resistance performance of the entire coating. More recently, it has been determined that decorative layers applied by PVD processes and containing zirconium or hafnium as the only metallic species are unusually and advantageously compared with decorative layers containing other metals, because normally they do not degrade the corrosion resistance of the coated article. Such layers can be used to extend the range of decorative PVD colors available from brass tones alone to black, gray and gold tones. See U.S. Pat. No. 6,245,435, the disclosure of which is incorporated by reference.

Still more recently, it has been determined that the presence of zirconium or hafnium as the sole metallic species in the decorative layer at the surface is not a sufficient condition to insure that the corrosion resistance of the coated article is not degraded in certain colors. Some non-brass decorative PVD colors, and specifically the range of copper tones, still do not perform acceptably in corrosion testing even when zirconium is substantially the only metal in the PVD layer at the surface. The present invention extends the range of colors available to include copper. More generally, the present invention can be used to solve a common problem of paradox encountered in surface engineering when a layer of material is required to fulfill several functions simultaneously and its thickness therefore is subject to several different and contradictory constraints.

FIG. 1 is a partial section of an article manufactured in accordance with the present disclosure. The substrate or article to be manufactured is indicated at 10 and preferably is of a material which is essentially free of surface flaws and porosity. It is preferably chosen from the group comprising zinc, aluminum and plastic.

Directly adjacent the substrate 10 is the corrosion protection layer 12 which may be one or more layers of copper, nickel and chromium. Such corrosion protection layers are well known in the art and there may be one such layer or more. Alternatively, the corrosion protection layer may be chosen from one of the group comprising nickel; duplex nickel; nickel/palladium; nickel, tungsten and boron; or nickel and tin. All of these corrosion protection layers are detailed in the prior art referenced above. The particular corrosion protection layer may vary, although economics may dictate the use of a conventional copper, nickel and chromium layer. The thickness of the layer 12 will vary, depending on the specific materials that are used. As an example, the combination of cyanide copper, acid copper, duplex nickel and chrome should have a minimum thickness of about 35 microns and a nominal thickness of about 48 microns.

Beneath the outer decorative coating there is a strike or adhesive layer 14 formed of compounds of Zr and/or Ti. The layer 14 should have a minimum thickness of about 0.025 micron and a nominal thickness of about 0.05 micron.

The color layer 16 provides the desired decorative color and is well described in the prior art. The composition of the color layer for a copper color is illustrated in Table 1.

Superimposed on the color layer 16 is a thin transparent layer 18, which layer fulfills at least two functions and in which the composition varies from a first composition to a second composition. In an especially advantageous example, a first function of the transition layer is to provide acceptable corrosion resistance and a second function is to maintain unchanged the color established by the color layer 16. In this example, the first composition is preferably pure metal, and, most preferable, pure zirconium as deposited (i.e. prior to release of vacuum in the PVD chamber). The second composition is preferably that of the color layer. The transition from the first composition to the second composition occurs over a distance of about 20–200 Å.

In Table 1 below, recipe 1 discloses a set of PVD deposition conditions for a copper colored layer 16, while recipe 2 discloses the deposition conditions for the same copper colored layer 16 modified by the addition of a thin transparent layer 18.

Figure 2:
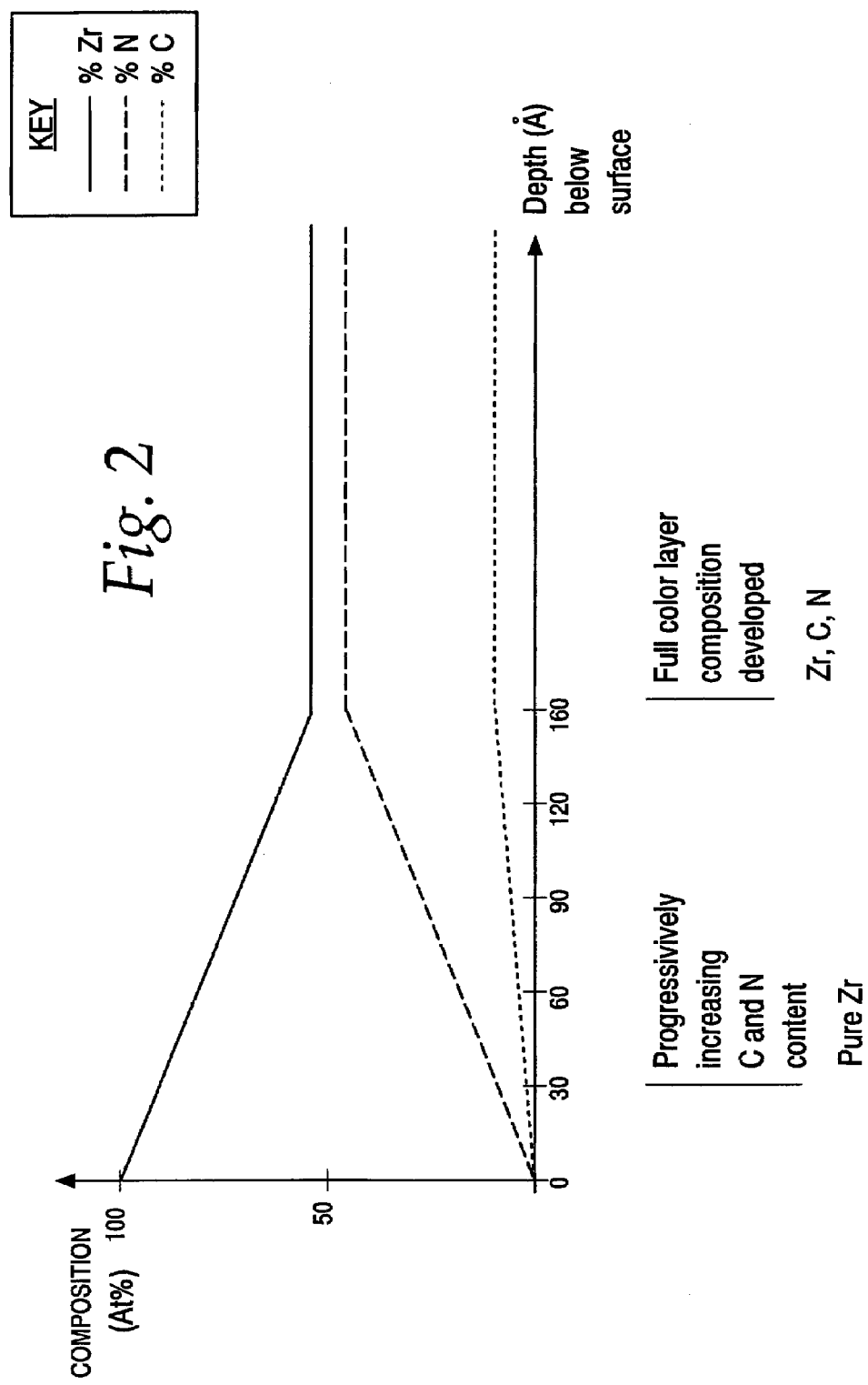
FIG. 2 is a diagram showing the composition of the as-deposited transition layer and color layer at various material depths.

Those skilled in the art of materials science would predict that the composition close to the surface of the coated article in the case of recipe 2, prior to exposure to atmosphere oxygen, would vary in layers 16 and 18 approximately according to FIG. 2, with layer 16 beginning at a depth of about 150 Å and the depth from 0–150 Å constituting layer 18. They would further predict that on exposure to the atmosphere, the surface would be modified by the addition of oxygen due to surface oxidation and by the addition of carbon, also known as "adventitious" carbon. The adventitious carbon would be deposited on the original surface while the oxygen would be incorporated into the original surface and chemically bound within it as well as adsorbed onto it. The original surface composition profile, as illustrated in FIG. 2, would then be modified as shown approximately in FIG. 3.

TABLE 1

| | | PVD finishing recipe # (HTC 1500 equipment) | |
|---|---|---|---|
| | | 1 | 2 |
| Color (L*, a*, b*) | | 65.6, +9.3, +12.0 | 64.9, +10.4, +12.2 |
| Target material | | Zr | Zr |
| Substrate | | Zinc diecast, chrome plated, SC2 (ASTMB456) | Zinc diecast, chrome plated, SC2 (ASTMB456) |
| Color layer Deposition parameters | Time (mins) | 25 | 24 |
| | 1. Cathode current (A) | 120 | 120 |
| | 2. Acetylene flow (sccm) | 43 | 43 |
| | 3. Nitrogen flow (sccm) | 400 | 400 |
| | 4. Argon flow (sccm) | 800 | 800 |
| | 5. Substrate bias (V) | 15 | 15 |
| | 6. Resulting thickness (Å) | 3400 | 3260 |
| | | | At Start    At Finish |
| Transition layer deposition parameters. The transition is accomplished smoothly over a period of 1 minute. | 1. Cathode current (A) | None | 120    120 |
| | 2. Acetylene flow (sccm) | | 43    0 |
| | 3. Nitrogen flow (sccm) | | 400    0 |
| | 4. Argon flow (sccm) | | 800    1200 |
| | 5. Substrate bias (V) | | 15    70 |
| Resulting salt spray corrosion test results (passes/sample size) (24 hour AASS, ASTM B117) | | 0/20 | 20/20 |

Figure 3:
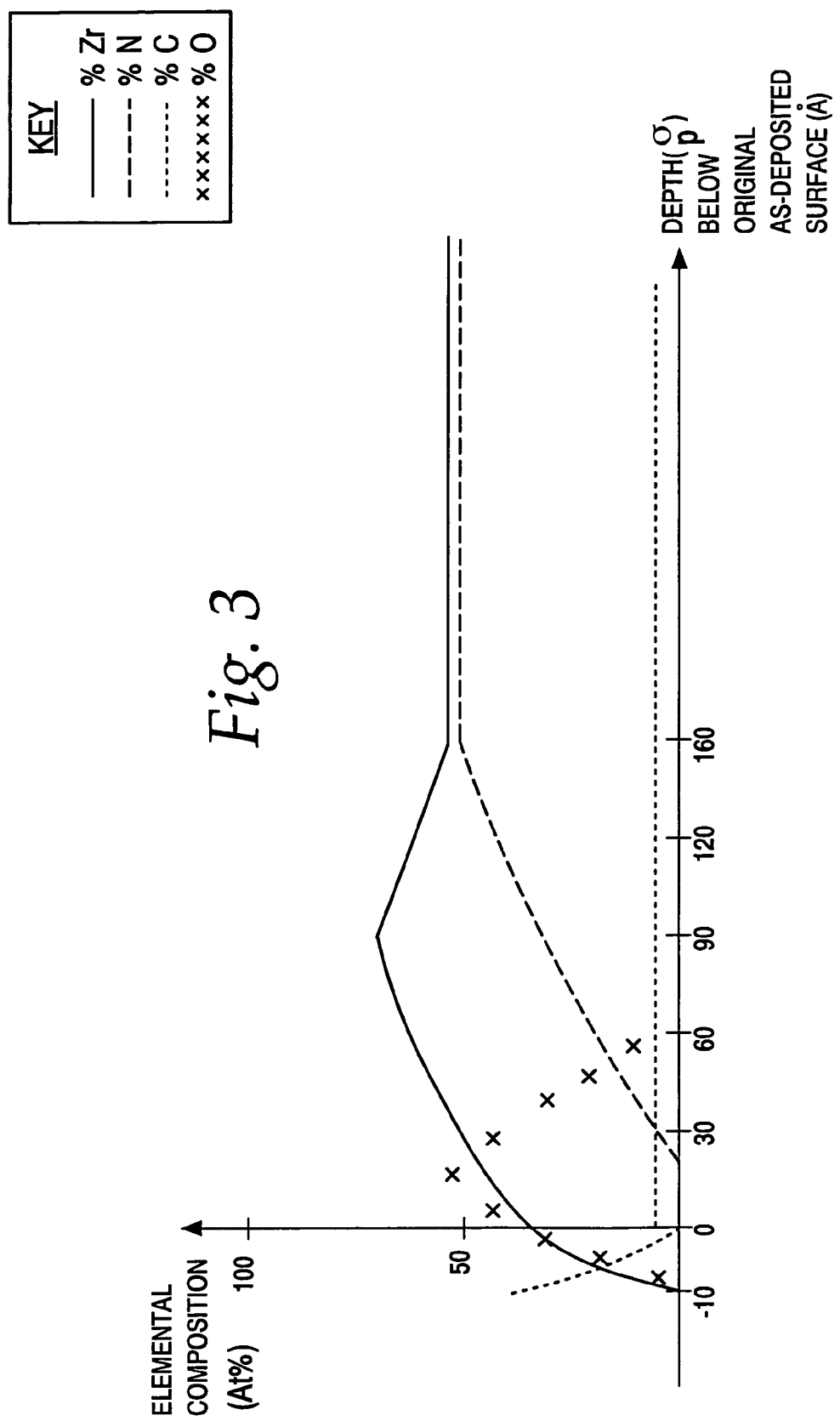
FIG. 3 is a diagram similar to FIG. 2 after the layers have been exposed to atmosphere.
Figure 4:
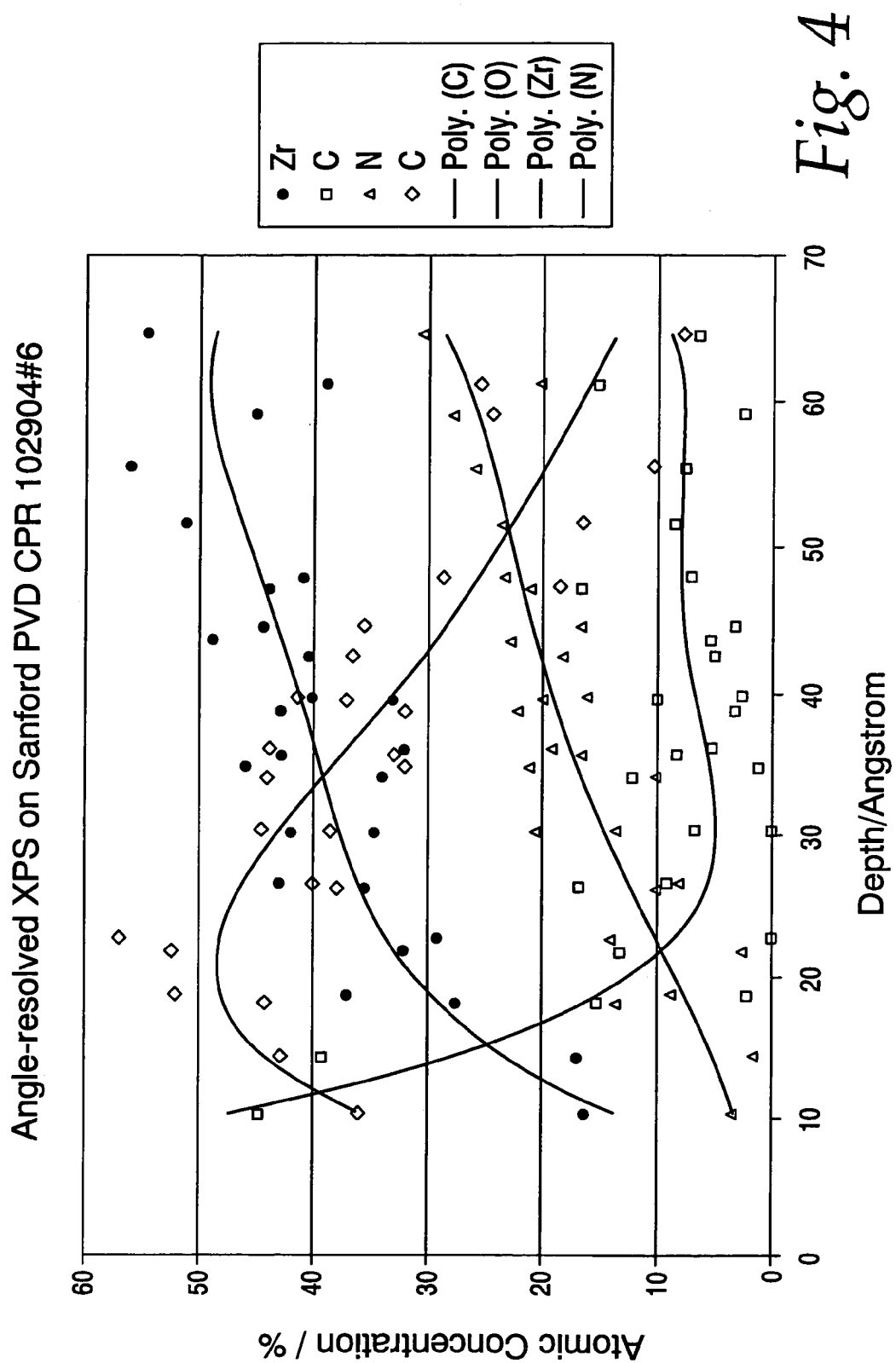
FIG. 4 is a chart showing the results of XPS analysis an article manufactured according to Table 1.

In FIG. 4, the results are plotted of a surface analysis study by angle resolved XPS of the elemental composition of an actual article manufactured using the PVD recipe 2 in the table above. The experimental results demonstrate the existence of the surface structure illustrated in FIG. 3.

Those skilled in the art of thin film manufacture will recognize that thin films are generally considered to become "optically dense" that is, likely to interact with visible light, at a thickness depending on refractive index, but generally greater than 150 Å. Those skilled in the art will also recognize that very thin corrosion protection films are known, but even gold films for corrosion protection purposes are normally thicker than 200 Å. According to the prior art therefore, the thin layer 18 would need to be thinner than about 150 Å in order to avoid an objectionable change in color, but paradoxically this same layer would need to be greater than at least 200 Å in order to confer the needed corrosion resistance. This is one example of paradox frequently encountered when a thin film is required to fulfill several functions simultaneously and the functions impose contradictory constraints on the thickness or other features of the film.

Referring to the actual structure of the thin transition layer as disclosed in Table 1 and FIGS. 3 and 4, it is not surprising, considering its thickness of 150 Å, that the added thin transition layer 18 has failed to alter the color of the copper color layer 16. It is however, quite unexpected that the thin transition layer has entirely eliminated severe corrosion failure.

Corrosion protection is essentially provided by the surface composition (first composition) of essentially pure Zr. A second composition, that of progressively less Zr and increased N and C insures that the color imparted by the color layer 16 will not be materially changed. Because of the varying nature of the composition of the transition layer 18, the effective position of the boundary between the thin transition layer 18 and the color layer 16 is different for optical phenomena and corrosion phenomena. The change in composition of the transition layer 18 from essentially pure Zr at the surface to gradually decreasing amounts of Zr and increasing amounts of N and C, define what is in essentially two compositions. The first composition is adjacent the surface and the second composition is distant from the surface. The first composition provides corrosion protection and the second composition insures that the overall thickness of the layer is such as to avoid an objectionable change in color from that derived from the layer 16.

The change in the composition of the transition layer 18, as illustrated in FIGS. 2 and 3, may be smooth or gradual or uniform. It may also be on a step-by-step basis.

Although as disclosed in FIGS. 2 and 3, and in Table 1, the color of the article of manufacture is derived from the color layer 16, and that color is visible at the surface because of the nature of the transition layer 18, it is within the scope of the invention for the color to be strongly modified from the transition layer 18, and more particularly, from that portion of the transition layer beginning at approximately 90 Å and extending to 150 Å. This would entail a chemical makeup different from that disclosed in FIGS. 2 and 3, but it is clearly within the scope of the present invention. In either event, the function of the second composition in the transition layer is to determine the color which is visible at the surface of the article of manufacture, whether that color be derived from the layer 16, or from a portion of the transition layer 18. It would also be possible to include one or more thin layers up to, say, 400 Å in thickness, of colorless, transparent material, for example, silicon dioxide or aluminum oxide, between layers 16 and 18, without altering the invention disclosed herein.

In a preferred embodiment of the invention the refractory metal for the transition layer is Zr. Ti, Hf, or alloys thereof, are also satisfactory for the transition layer because of its nature in having a portion thereof function as corrosion protection and another portion function to permit the color of the underlying layer 16 to be visible at the surface. Further, the metal in the first composition may be a noble metal chosen from the group consisting of gold, silver, platinum, platinum group metals or alloys thereof. In addition, chromium or stainless steel will also satisfactorily function as the metallic material for the transition layer.

Whereas the preferred form of the invention has been shown and described herein, it should be realized that there may be many modifications, substitutions and alterations thereto.

The embodiments of the invention in which an exclusive property or privilege is claimed are defined as follows:

1. An article having on at least a portion of its surface, a coating of a thin transition layer consisting of a metal bearing material and having a composition that varies from an exterior first composition comprising a metal to a second composition beneath the exterior first composition, which transition layer is superimposed on a metal bearing color layer and is substantially transparent and colorless to visible light, in which the first composition is a noble metal chosen from the group consisting of gold, silver, platinum, platinum group metals, or an alloy thereof.

2. The article of claim 1 in which the metal bearing color layer has the same composition as the second composition in the transition layer.

3. The article of claim 1 in which the composition of the metal bearing color layer is chosen from one or more of Zr, Ti, Hf, C and N.

4. The article of claim 1 in which the transition layer is deposited by a PVD process.

5. The article of claim 1 in which the metal bearing color layer is deposited by a PVD process.

6. The article of claim 1 in which the transition between the first composition and the second composition of the transition layer is smooth.

7. The article of claim 1 in which the transition between the first composition and the second composition of the transition layer is in discrete steps.

8. The article of claim 1 in which the first composition of the transition layer provides corrosion resistance.

9. The article of claim 1 wherein the transition layer has a thickness of about 150 Å or less.

10. The article of claim 1, wherein the transition layer is adjacent to the metal bearing color layer.

11. The article of claim 1 in which one or more intermediate layers are interposed between the transition layer and the metal bearing color layer, said intermediate layer(s) being colorless, transparent, and less than 400 Å in thickness.

12. An article having on at least a portion of its surface, a coating of a thin transition layer consisting of a metal bearing material and having a composition that varies from an exterior first composition comprising a metal to a second composition beneath the exterior first composition, which transition layer is superimposed on a metal bearing color layer and is substantially transparent and colorless to visible light, in which the first composition is a corrosion resistant metal chosen from the group consisting of chromium or stainless steel, or an alloy thereof.

13. The article of claim 12 in which one or more intermediate layers are interposed between the transition layer and the metal bearing color layer, said intermediate layer(s) being colorless, transparent, and less than 400 Å in thickness.

14. The article of claim 12 in which the metal bearing color layer has the same composition as the second composition in the transition layer.

15. The article of claim 12 in which the composition of the metal bearing color layer is chosen from one or more of Zr, Ti, Hf, C and N.

16. The article of claim 12 in which the transition layer is deposited by a PVD process.

17. The article of claim 12 in which the metal bearing color layer is deposited by a PVD process.

18. The article of claim 12 in which the transition between the first composition and the second composition of the transition layer is smooth.

19. The article of claim 12 in which the transition between the first composition and the second composition of the transition layer is in discrete steps.

20. The article of claim 12 in which the first composition of the transition layer provides corrosion resistance.

21. The article of claim 12, wherein the transition layer has a thickness of about 150 Å or less.

22. The article of claim 12, wherein the transition layer is adjacent to the metal bearing color layer.

* * * * *